(12) United States Patent
Teraguchi et al.

(10) Patent No.: US 7,659,770 B2
(45) Date of Patent: Feb. 9, 2010

(54) HIGH FREQUENCY SWITCHING CIRCUIT

(75) Inventors: Takayuki Teraguchi, Kanagawa-ken (JP); Katsue Kawakyu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/099,858

(22) Filed: Apr. 9, 2008

(65) Prior Publication Data
US 2008/0258799 A1 Oct. 23, 2008

(30) Foreign Application Priority Data
Apr. 17, 2007 (JP) .............................. 2007-108284

(51) Int. Cl.
*H03K 3/01* (2006.01)
(52) U.S. Cl. ...................... 327/534; 327/427
(58) Field of Classification Search ................ 327/427, 327/534
See application file for complete search history.

(56) References Cited

U.S. PATENT DOCUMENTS

| | | | | |
|---|---|---|---|---|
| 2,745,960 A * | 5/1956 | Griffith | ....................... | 331/110 |
| 3,056,913 A * | 10/1962 | Henderson et al. | ............ | 322/28 |
| 5,350,957 A * | 9/1994 | Cooper et al. | ................ | 327/427 |
| 5,731,607 A * | 3/1998 | Kohama | ...................... | 257/275 |
| 5,774,792 A * | 6/1998 | Tanaka et al. | ................. | 455/78 |
| 5,969,560 A * | 10/1999 | Kohama et al. | ............. | 327/308 |
| 5,990,580 A * | 11/1999 | Weigand | ..................... | 307/125 |
| 6,094,088 A * | 7/2000 | Yano | ......................... | 327/534 |
| 6,380,644 B1 * | 4/2002 | Iliasevitch | .................. | 307/130 |
| 6,836,172 B2 * | 12/2004 | Okashita | ..................... | 327/382 |
| 7,221,207 B2 * | 5/2007 | Fukumoto et al. | ........... | 327/365 |

FOREIGN PATENT DOCUMENTS

JP 10-242826 9/1998

* cited by examiner

*Primary Examiner*—Lincoln Donovan
*Assistant Examiner*—William Hernandez
(74) *Attorney, Agent, or Firm*—Turocy & Watson, LLP

(57) ABSTRACT

A high frequency switching circuit is disclosed. The high frequency switching circuit is provided with first and second high frequency signal terminals, a control terminal, a field-effect transistor having a drain, a source and a gate. The field-effect transistor is connected between the first and the second high frequency signal terminals so as to switch a high frequency signal. The high frequency switching circuit is further provided with a variable resistance circuit which is connected between the gate of the field-effect transistor and the control terminal.

20 Claims, 5 Drawing Sheets

HIGH FREQUENCY SWITCHING CIRCUIT

CROSS REFERENCE TO RELATED APPLICATION

The application is based upon and claims the benefit of priority from the prior Japanese Patent Application No. 2007-108284, filed on Apr. 17, 2007, the entire contents of which are incorporated herein by reference.

FIELD OF THE INVENTION

The present invention relates to a high frequency switching circuit having a field-effect transistor for switching a higher frequency signal.

DESCRIPTION OF THE BACKGROUND

A high frequency switching circuit is a important constituent part for a radio communication system such as a mobile communication or a LAN system. Lots of high frequency switching circuits are used in mobile phones, radio infrastructure facilities, satellite communication facilities or cable television facilities.

A high frequency switching circuit is disclosed in U.S. Pat. No. 6,094,088, for example.

The high frequency switching circuit mentioned in the United States patent is provided with a pair of FETs (Field Effect Transistors) called as "Through FETs" and a pair of FETs called as "Shunt FETs", which are used to switch two higher frequency input signals selectively. The high frequency switching circuit has capacitances respectively between the gate and the drain, between the back-gate and the drain, between the gate and the source and between the back-gate and the source, with respect to each of the Through FETs.

Further, the high frequency switching circuit has capacitances respectively between the gate and the drain, between the back-gate and the drain, between the gate and the source and between the back-gate and the source, with respect to each of the Shunt FETs.

The gates and back-gates of the Through FETs and Shunt FETs connect with resistors respectively. These resistors serve to suppress leakage of higher frequency signal when any selected one of the Through FETs and any selected one of the Shunt FETs are in an ON state.

However, there is a problem that, when any selected one of the Through FETs and any selected one of Shunt FETs are in an OFF state, high frequency signal supplied from the drain sides leaks to the source sides via the capacitances due to existence of the resistors.

The leakage of the higher frequency signal from the drain sides to the source sides causes lowering isolation characteristics of the Through FETs and the Shunt FETs in the OFF state so that the high frequency switching characteristic lowers.

SUMMARY OF THE INVENTION

An aspect of the present invention provides a high frequency switching circuit, which comprises first and second high frequency signal terminals, a first control terminal, a first field-effect transistor having a drain, a source and a gate, the first field-effect transistor being connected between the first and the second high frequency signal terminals to switch a higher frequency signal, and a variable resistance circuit connected between the gate of the first field-effect transistor and the first control terminal.

Another aspect of the present invention provides a high frequency switching circuit, which comprises first and second high frequency signal terminals, a power supply terminal, a first control terminal, a first field-effect transistor having a drain, a source and a gate, the first field-effect transistor being connected between the first and the second high frequency signal terminals to switch a higher frequency signal, a second field-effect transistor having a drain, a source and a gate, the first field-effect transistor being connected between the first and the second high frequency signal terminals, and a variable resistance circuit connected between the gate of the second field-effect transistor and the second control terminal.

Further another aspect of the present invention provides a high frequency switching circuit, which comprises a pair of first high frequency signal terminals, a second high frequency signal terminal serving as a common high frequency signal terminal, first and second control terminals, a pair of first field-effect transistors respectively having a drain, a source and a gate, the first field-effect transistors being respectively connected between the first high frequency signal terminals and the second high frequency signal terminal to switch first and second high frequency signal and a pair of variable resistance circuits connected between the gates of the first field-effect transistors and the first and second control terminals respectively.

DETAILED DESCRIPTION OF THE INVENTION

Embodiments of the present invention will be explained with reference to the drawings.

Figure 1:
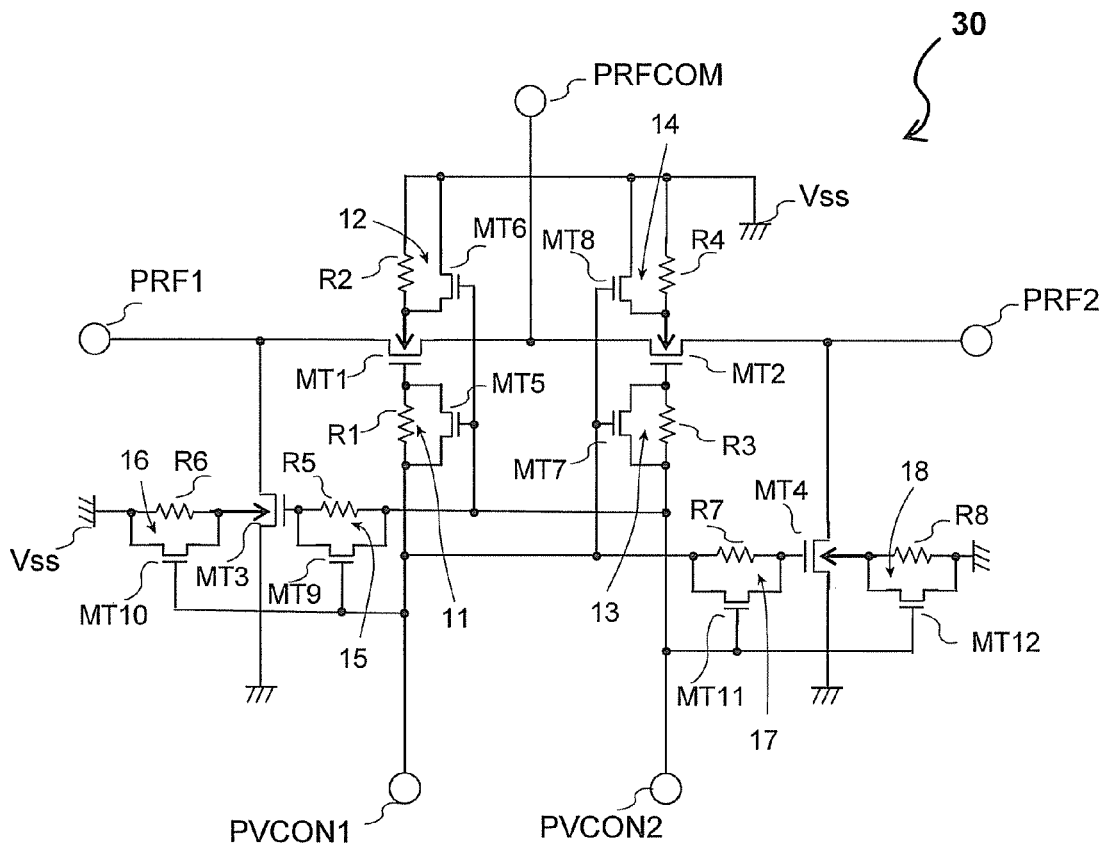
FIG. 1 is a circuit diagram showing a configuration of a high frequency switching circuit according to a first embodiment of the present invention.

A first embodiment of the present invention will be explained with reference to FIG. 1. FIG. 1 is a circuit diagram showing a configuration of a high frequency switching circuit according to the first embodiment of the present invention. The high frequency switching circuit of the first embodiment is a SPDT (Single Pole Double Throw) type switch which is used as an antenna switch of a cellar phone, for example.

As show in FIG. 1, the high frequency switching circuit 30 is provided with N-channel MOS transistors MT1 to MT12 as insulated-gate field-effect transistor, resistors R1 to R8, a pair of RF (radio frequency) signal terminals PRF1, PRF2 as first high frequency signal terminals, a common RF terminal PRF- COM as a second high frequency signal terminal, control terminals PVCON1, PVCON2 as first and second control terminals.

The N-channel MOS transistors MT1 to MT12 are an enhancement type (E-type) MOS transistor having source, drain and gate. The N-channel MOS transistors MT1 to MT4 are further provided with back-gates respectively.

It is desirable that the N-channel MOS transistors MT1-MT4 are those having a threshold voltage larger than that of the N-channel MOS transistors to be used in a high speed logic circuit etc., in order to suppress leak current in an OFF state of the N-channel MOS transistors MT1-MT4.

The N-channel MOS transistors MT1, MT2 are Through FETs as first field-effect transistors. The N-channel MOS transistors MT3, MT4 are Shunt FETs as second field-effect transistors.

The common RF terminal PRFCOM is electrically connected to a port provided on an antenna side so as to output first and second high frequency signals, i.e. analog RF signals, to the antenna (not shown). The control terminals PVCON1, PVCON2 receive first and second control signals to control the N-channel MOS transistors MT1, MT2 respectively. The first and second high frequency signals are switched by the N-channel MOS transistors MT1, MT2 under control of the first and second control signals, so as to flow alternatively from the RF signal terminals PRF1, PRF2 to the common RF terminal PRFCOM selectively.

One of the source and drain of the N-channel MOS transistor MT1 is connected with the RF signal terminals PRF1. The other of the source and drain of the N-channel MOS transistor MT1 is connected with the common RF terminal PRFCOM. The gate of the N-channel MOS transistor MT1 receives the first control signal output from the control terminal PVCON1. The N-channel MOS transistor MT1 transmits the first high frequency signal received from the RF signal terminal PRF1 to the common RF terminal PRFCOM when the first control signal is at a "High" level.

One of the source and drain of the N-channel MOS transistor MT2 is connected with the RF signal terminals PRF2. The other of the source and drain of the N-channel MOS transistor MT2 is connected with the common RF terminal PRFCOM. The gate of the N-channel MOS transistor MT2 receives the second control signal output from the control terminal PVCON2. The N-channel MOS transistor MT2 transmits the second high frequency signal received from the RF signal terminal PRF2 to the common RF terminal PRFCOM when the second control signal is at a "High" level.

One of the source and drain of the N-channel MOS transistor MT3 is connected with the RF signal terminal PRF1. The other of the source and drain of the N-channel MOS transistor MT3 is connected with a power supply Vss of a lower voltage (earth voltage). The gate of the N-channel MOS transistor MT3 receives the second control signal output from the control terminal PVCON2. The N-channel MOS transistor MT3 is kept in an ON state so as to connect the RF signal terminal PRF1 to the power supply Vss of the lower voltage (earth voltage), when the second control signal is at a "High" level.

One of the source and drain of the N-channel MOS transistor MT4 is connected with the RF signal terminal PRF2. The other of the source and drain of the N-channel MOS transistor MT4 is connected with the power supply Vss of the lower voltage (earth voltage). The gate of the N-channel MOS transistor MT4 receives the first control signal output from the control terminal PVCON1. The N-channel MOS transistor MT4 is kept in an ON state so as to connect the RF signal terminal PRF2 to the power supply Vss of the lower voltage (earth voltage), when the first control signal is at a "High" level.

One end of the resistor R1 is connected to the control terminal PVCON1. The other end of the resistor R1 is connected to the gate of the N-channel MOS transistor MT1. One the other of the source and drain of the N-channel MOS transistor MT5 is connected to the gate of the N-channel MOS transistor MT1. The other of the source and drain of the N-channel MOS transistor MT5 is connected to the control terminal PVCON1. The gate of the N-channel MOS transistor MT5 receives the second control signal output from the control terminal PVCON2.

The resistor R1 and the N-channel MOS transistor MT5 are connected with each other in parallel and constitute a variable resistance circuit 11 as a first variable resistance circuit. The variable resistance circuit 11 shows the resistance value of the resistor R1 approximately, when the second control signal is at a "Low" level. The variable resistance circuit 11 shows the ON resistance value of the N-channel MOS transistor MT5 approximately, when the second control signal is at a "High" level. The resistance value of the resistor R1 is larger than the ON resistance value of the N-channel MOS transistor MT5. Preferably, the resistance value of the resistor R1 is, for example, about $10^3$ times as large as the ON resistance value of the N-channel MOS transistor MT5.

One end of the resistor R2 is connected to the power supply Vss of the lower voltage (earth voltage). The other end of the resistor R2 is connected to the back-gate of the N-channel MOS transistor MT1. One of the source and drain of the N-channel MOS transistor MT6 is connected to the back-gate of the N-channel MOS transistor MT1. The other of the source and drain of the N-channel MOS transistor MT6 is connected to the power supply Vss of the lower voltage (earth voltage). The gate of the N-channel MOS transistor MT6 receives the second control signal output from the control terminal PVCON2.

The resistor R2 and the N-channel MOS transistor MT6 are connected with each other in parallel and constitute a variable resistance circuit 12 as the second variable resistance circuit. The variable resistance circuit 12 shows the resistance value of the resistor R2 approximately, when the second control signal is at a "Low" level. The variable resistance circuit 12 shows the ON resistance value of the N-channel MOS transistor MT6 approximately, when the second control signal is at a "High" level. The resistance value of the resistor R2 is larger than the ON resistance value of the N-channel MOS transistor MT6. Preferably, the resistance value of the resistor R2 is, for example, about $10^3$ times as large as the ON resistance value of the N-channel MOS transistor MT6.

One end of the resistor R3 is connected to the control terminal PVCON2. The other end of the resistor R3 is connected to the gate of the N-channel MOS transistor MT2. One of the source and drain of the N-channel MOS transistor MT7 is connected to N-channel MOS transistor MT2. The other of the source and drain of the N-channel MOS transistor MT7 is connected to the control terminal PVCON2. The gate of the N-channel MOS transistor MT7 receives the first control signal output from the control terminal PVCON1.

The resistor R3 and the N-channel MOS transistor MT7 are connected with each other in parallel and constitute a variable resistance circuit 13 as a first variable resistance circuit. The variable resistance circuit 13 shows the resistance value of the resistor R3 approximately, when the first control signal is at a "Low" level. The variable resistance circuit 13 shows the ON resistance value of the N-channel MOS transistor MT7 approximately, when the first control signal is at a "High"

level. The resistance value of the resistor R3 is larger than the ON resistance value of the N-channel MOS transistor MT7. Preferably, the resistance value of the resistor R3 is, for example, about $10^3$ times as large as the ON resistance value of the N-channel MOS transistor MT7.

One end of the resistor R4 is connected to the power supply Vss of the lower voltage (earth voltage). The other end of the resistor R4 is connected to the back-gate of the N-channel MOS transistor MT2. One of the source and drain of the N-channel MOS transistor MT8 is connected to the back-gate of the N-channel MOS transistor MT2. The other of the source and drain of the N-channel MOS transistor MT8 is connected to the power supply Vss of the lower voltage (earth voltage). The gate of the N-channel MOS transistor MT8 receives the first control signal output from the control terminal PVCON1.

The resistor R4 and the N-channel MOS transistor MT8 are connected with each other in parallel and constitute a variable resistance circuit 14 as a second variable resistance circuit. The variable resistance circuit 14 shows the resistance value of the resistor R4 approximately, when the first control signal is at a "Low" level. The variable resistance circuit 14 shows the ON resistance value of the N-channel MOS transistor MT8 approximately, when the first control signal is at a "High" level. The resistance value of the resistor R4 is larger than the ON resistance value of the N-channel MOS transistor MT8. Preferably, the resistance value of the resistor R4 is, for example, about $10^3$ times as large as the ON resistance value of the N-channel MOS transistor MT8.

One end of the resistor R5 is connected to the control terminal PVCON2. The other end of the resistor R4 is connected to the gate of the N-channel MOS transistor MT3. One of the source and drain of the N-channel MOS transistor MT9 is connected to the gate of the N-channel MOS transistor MT3. The other of the source and drain of the N-channel MOS transistor MT9 is connected to the control terminal PVCON2. The gate of the N-channel MOS transistor MT9 receives the first control signal output from the control terminal PVCON1.

The resistor R5 and the N-channel MOS transistor MT9 are connected with each other in parallel and constitute a variable resistance circuit 15 as a third variable resistance circuit. The variable resistance circuit 15 shows the resistance value of the resistor R5 approximately, when the first control signal is at a "Low" level. The variable resistance circuit 13 shows the ON resistance value of the N-channel MOS transistor MT9 approximately, when the first control signal is at a "High" level. The resistance value of the resistor R5 is larger than the ON resistance value of the N-channel MOS transistor MT9. Preferably, the resistance value of the resistor R5 is, for example, about $10^3$ times as large as the ON resistance value of the N-channel MOS transistor MT9.

One end of the resistor R6 is connected to the power supply Vss of the lower voltage (earth voltage). The other end of the resistor R6 is connected to the back-gate of the N-channel MOS transistor MT3. One the other of the source and drain of the N-channel MOS transistor MT10 is connected to the back-gate of the N-channel MOS transistor MT3. The other of the source and drain of the N-channel MOS transistor MT10 is connected to the power supply Vss of the lower voltage (earth voltage). The gate of the N-channel MOS transistor MT10 receives the first control signal output from the control terminal PVCON1.

The resistor R6 and the N-channel MOS transistor MT10 are connected with each other in parallel and constitute a variable resistance circuit 16 as a fourth variable resistance circuit. The variable resistance circuit 16 shows a resistance value of the resistor R6 approximately, when the first control signal is at a "Low" level. The variable resistance circuit 16 shows an ON resistance value of the N-channel MOS transistor MT10 approximately, when the first control signal is at a "High" level. The resistance value of the resistor R6 is larger than the ON resistance value of the N-channel MOS transistor MT10. Preferably, the resistance value of the resistor R6 is, for example, about $10^3$ times as large as the ON resistance value of the N-channel MOS transistor MT10.

One end of the resistor R7 is connected to the control terminal PVCON1. The other end of the resistor R7 is connected to the gate of the N-channel MOS transistor MT4. One of the source and drain of the N-channel MOS transistor MT11 is connected to the gate of the N-channel MOS transistor MT4. The other of the source and drain of the N-channel MOS transistor MT11 is connected to the control terminal PVCON1. The gate of the N-channel MOS transistor MT11 receives the second control signal output from the control terminal PVCON2.

The resistor R7 and the N-channel MOS transistor MT11 are connected with each other in parallel and constitute a variable resistance circuit 17 as a third variable resistance circuit. The variable resistance circuit 17 shows the resistance value of the resistor R7 approximately, when the second control signal is at a "Low" level. The variable resistance circuit 17 shows the ON resistance value of the N-channel MOS transistor MT11 approximately, when the second control signal is at a "High" level. The resistance value of the resistor R7 is larger than the ON resistance value of the N-channel MOS transistor MT11. Preferably, the resistance value of the resistor R7 is, for example, about $10^3$ times as large as the ON resistance value of the N-channel MOS transistor MT11.

One end of the resistor R8 is connected to the power supply Vss of the lower voltage (earth voltage). The other end of the resistor R8 is connected to the back-gate of the N-channel MOS transistor MT4. One of the source and drain of the N-channel MOS transistor MT12 is connected to the back-gate of the N-channel MOS transistor MT4. The other of the source and drain of the N-channel MOS transistor MT12 is connected to the power supply Vss of the lower voltage (earth voltage). The gate of the N-channel MOS transistor MT12 receives the second control signal output from the control terminal PVCON2.

The resistor R8 and the N-channel MOS transistor MT12 are connected with each other in parallel and constitute a variable resistance circuit 18 as a fourth variable resistance circuit. The variable resistance circuit 18 shows the resistance value of the resistor R8 approximately, when the second control signal is at a "Low" level. The variable resistance circuit 18 shows the ON resistance value of the N-channel MOS transistor MT12 approximately, when the second control signal is at a "High" level. The resistance value of the resistor R8 is larger than the ON resistance value of the N-channel MOS transistor MT12. Preferably, the resistance value of the resistor R8 is, for example, about $10^3$ times as large as the ON resistance value of the N-channel MOS transistor MT12.

Operation of the high frequency switching circuit 30 will be described. In FIG. 1, the N-channel MOS transistors MT1, MT4 are in an ON state, when the first control signal output from the control terminal PVCON1 is at an active "High" level and when the second control signal output from the control terminal PVCON2 is at a non-active "Low" level. Accordingly, the first high frequency signal (RF signal) as an analog signal, which is output from the RF terminal PRF1, is transmitted to the common RF terminal PRFCOM.

The N-channel MOS transistors MT2, MT3 are in an ON state, when the first control signal output from the control terminal PVCON1 is at a non-active "Low" level and when the second control signal output from the control terminal PVCON2 is at an active "High" level. Accordingly, the second high frequency signal (RF signal) as an analog signal, which is output from the RF terminal PRF2, is transmitted to the common RF terminal PRFCOM.

Figure 2:
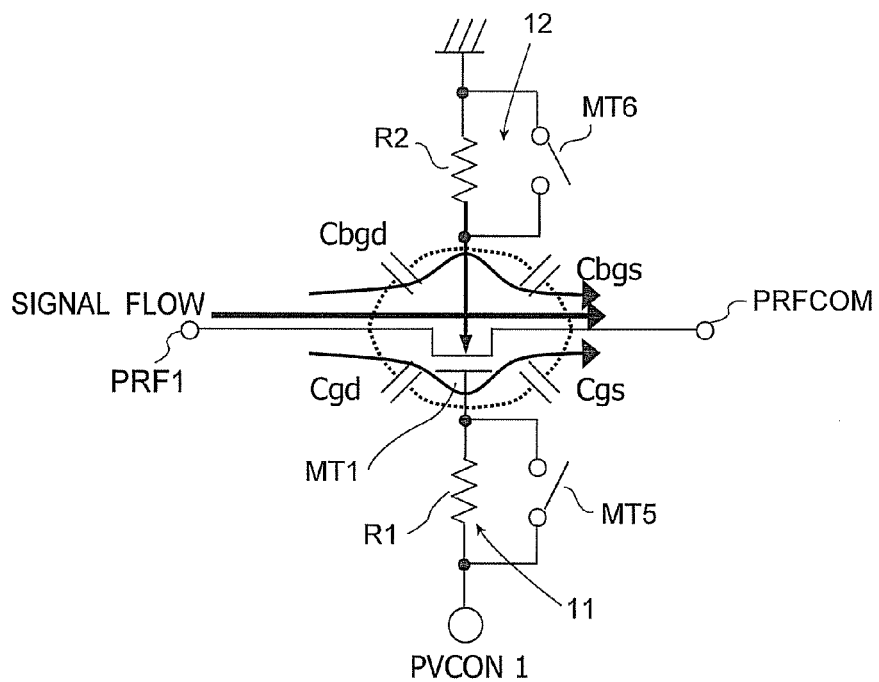
FIG. 2 is a schematic diagram showing a signal flow in an ON state of a Through FET of the first embodiment.
Figure 3:
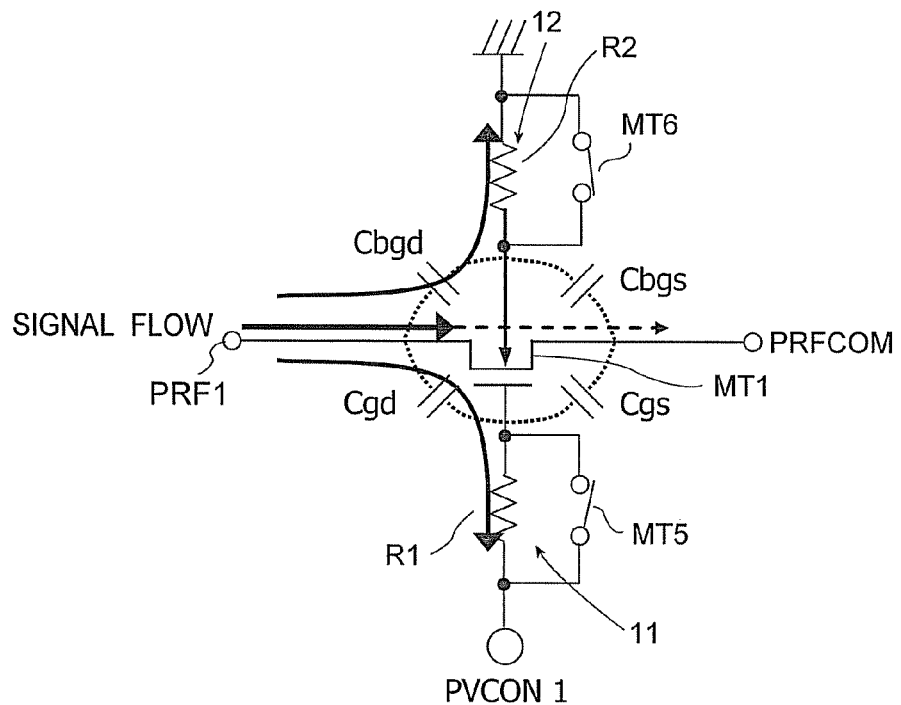
FIG. 3 is a schematic diagram showing a signal flow in an OFF state of the Through FET of the first embodiment.

Signal flows of the high frequency switching circuit 30 will be described with reference to FIGS. 2 to 4. FIGS. 2 and 3 show equivalent circuits of the portion including the N-channel MOS transistor MT1 and the surrounding which is illustrated on the left side of FIG. 1. In FIG. 2, a signal flow in an ON state of the N-channel MOS transistors MT1, MT4 of FIG. 1 is shown. In FIG. 3, a signal flow in an OFF state of the N-channel MOS transistors MT1, MT4 of FIG. 1 is shown.

Figure 4:
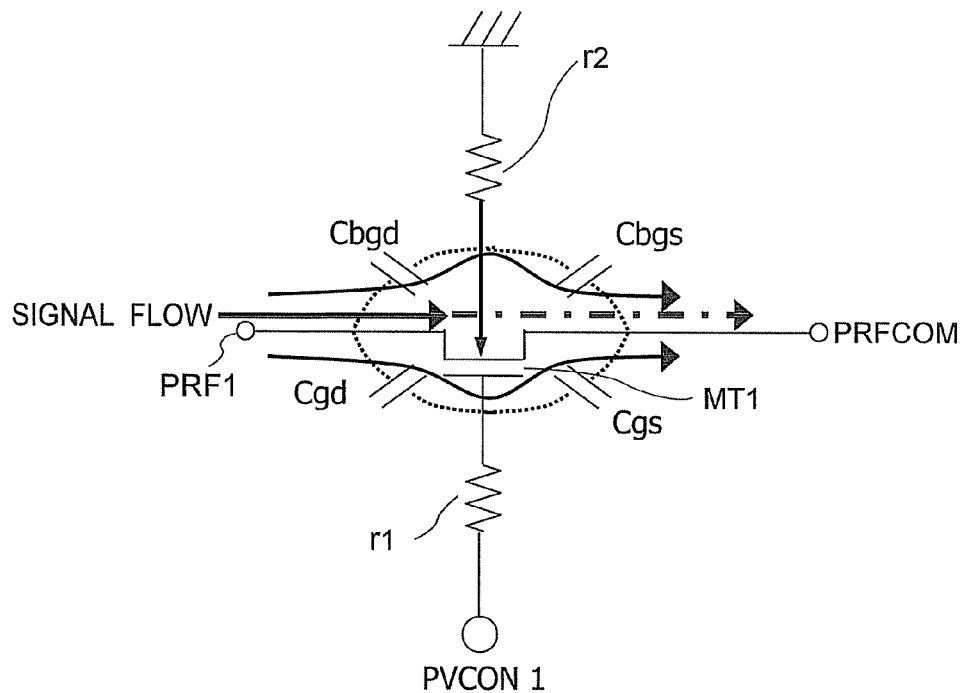
FIG. 4 is a schematic diagram showing a signal flow in an OFF state of a Through FET of a prior art.

FIG. 4 shows a prior art. The prior art is a circuit which does not have such transistors as the N-channel MOS transistors MT5, MT6 which are shown in FIG. 3. In the prior art, resistors r1, r2 is connected to the gate and back-gate of the N-channel MOS transistors MT1 respectively. In FIG. 4, a signal flow in an OFF state of the N-channel MOS transistors MT1, MT4 of FIG. 1 is shown. The resistors r1, r2 are set to have an approximately 10 k$\Omega$ resistance value to suppress leakage of high frequency signal.

As shown in FIG. 2, the "High" level of the first control signal is applied to the gate of the N-channel MOS transistor MT1 (and the gate of the N-channel MOS transistor MT4 of FIG. 1) so as to render the N-channel MOS transistors MT1 (and the N-channel MOS transistor MT4) in an ON state, when the N-channel MOS transistors MT5, MT6 of FIG. 1 are in an OFF state.

The resistors R1, R2, which connect with the gate and back-gate of the N-channel MOS transistor MT1 respectively, are set at a resistance value of several M$\Omega$ or more, for example. Thus, the variable resistance circuits 11, 12 show a relatively high resistance value at the above stage.

Accordingly, a high frequency signal is transmitted from the drain to the source of the N-channel MOS transistor MT1 with a small loss via the capacitance Cgd between the gate and drain, the capacitance Cgs between the gate and source, the capacitance Cbgd between the back-gate and drain and the capacitance Cbgs between the back-gate and source, respectively of the N-channel MOS transistor MT1.

As shown in FIG. 3, when the N-channel MOS transistors MT5, MT6 of FIG. 1 are in an OFF state, the "Low" level of the first control signal is applied to the gate of the N-channel MOS transistor MT1 (and the gate of the N-channel MOS transistor MT4 of FIG. 1) so as to render the N-channel MOS transistor MT1 (and the N-channel MOS transistor MT4) in an OFF state, The resistors R1, R2, which connect with the gate and back-gate of the N-channel MOS transistor MT1 respectively, are set at a resistance value of several $\Omega$, for example. Thus, the variable resistance circuits 11, 12 show a relatively small resistance value at the above stage.

Accordingly, a high frequency signal is transmitted from the drain of the N-channel MOS transistor MT1 to the control terminal PVCON1 and the power supply Vss of the lower voltage (earth voltage) via the capacitance Cgd between the gate and drain and the capacitance Cbgd and between the back-gate and drain, respectively of the N-channel MOS transistor MT1. The high frequency signal is hardly transmitted to the source of the N-channel MOS transistor MT1.

According to the embodiment of FIG. 1, the resistance values of the variable resistance circuits 11, 12, 17 and 18 in ON and OFF state of the N-channel MOS transistors MT5, MT6 are capable of being set at appropriate values independently. As a result, the signal transmission and isolation characteristics are sufficient when the N-channel MOS transistors MT1, MT4 are in an ON state. The operations of the N-channel MOS transistors MT2 to MT4 and MT7 to MT12 respectively of FIG. 1 are similar.

FIG. 4 shows the case of lack of N-channel MOS transistors connecting with the gate and back-gate of the N-channel MOS transistor MT1. As shown in FIG. 4, the high frequency signal is transmitted from the drain to the source of the N-channel MOS transistor MT1, but is hardly transmitted from the drain of the N-channel MOS transistor MT1 to the control terminal PVCON1 and to the power supply Vss of the lower voltage (earth voltage), when the "Law" level of the first control signal is applied to the gate of the N-channel MOS transistor MT1 (and the gate of the N-channel MOS transistor MT4 of FIG. 1) so as to render the N-channel MOS transistors MT1 (and the N-channel MOS transistor MT4) in an OFF state.

As mentioned above, the resistors r1, r2, which connect with the gate and back-gate of the N-channel MOS transistor MT1 respectively, are set at a resistance value of several $\Omega$, for example. Thus, a high frequency signal is transmitted from the drain to the source, respectively of the N-channel MOS transistor MT1, via the capacitance Cgd between the gate and the drain, the capacitance Cgs between the gate and the source, the capacitance Cbgd between the back-gate and the drain and the capacitance Cbgs and between the back-gate and source, respectively of the N-channel MOS transistor MT1.

The prior art of FIG. 4 is lack of N-channel MOS transistors connecting with the gate and back-gate of the N-channel MOS transistor MT1. The prior art is only provided with the resistors r1, r2 connecting with the gate and back-gate of the N-channel MOS transistor MT1 respectively.

As a result, the signal transmission and isolation characteristics are insufficient.

Figure 5:
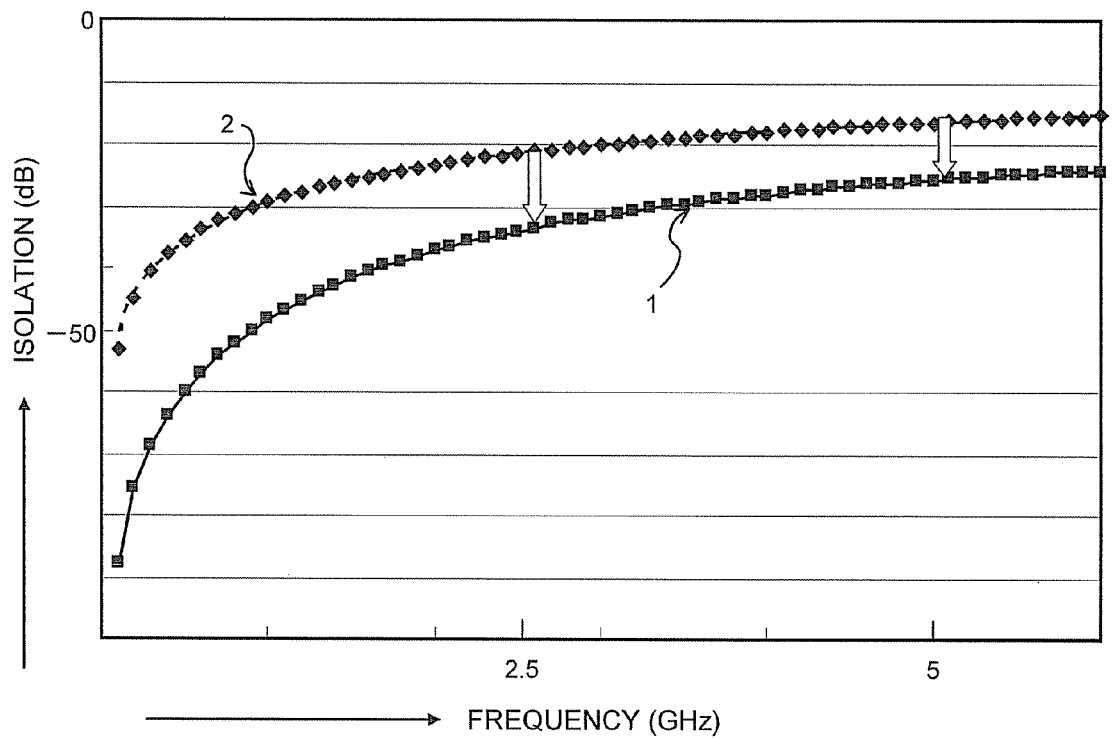
FIG. 5 shows the isolation characteristic with respect to frequency of the first embodiment in comparison with that of the prior art.

The isolation characteristic of the high frequency switching circuit of the first embodiment will be described with reference to FIG. 5. In FIG. 5, curve 1 shows the isolation characteristic with respect to frequency according to the embodiment. Curve 2 shows the isolation characteristic with respect to frequency according to the prior art of FIG. 4.

As shown in FIG. 5, according to the first embodiment, the variable resistance circuits 11 to 18 are connected to the gates and back-gates of the N-channel MOS transistor MT1 to MT4, which are a Through FET or a Shunt FET. Therefore, the isolation characteristic for the high frequency signals are more sufficient than the prior art. In the case the frequency of the high frequency signals is 2.5 GHz, the first embodiment may raise the isolation characteristic 12.5 dB more than the prior art. In the case the frequency of the high frequency signals is 5 GHz, the first embodiment may raise the isolation characteristic 9.5 dB more than the prior art.

As described above, according to the high frequency switching circuit of the embodiment, the resistance values of the variable resistance circuits 11 to 18 in ON and OFF state of the N-channel MOS transistors MT1 to MT4 are respectively capable of being set at an appropriate value independently, so as to suppress leakage of the high frequency signals. The resistance value in an ON state of the N-channel MOS transistors MT1 to MT4 may be, for example, about $10^3$ times or more as large as those in an OFF state of the N-channel MOS transistors MT1 to MT4.

As a result, leakage of the high frequency signals is effectively suppressed from the drain to the source of the N-channel MOS transistors MT1 to MT4 so that the isolation characteristic may be raised in an OFF state of the N-channel MOS transistors MT1 to MT4.

In the embodiment, the N-channel MOS transistors MT5 to MT12 may be replaced with P-channel MOS transistors. In the case the P-channel MOS transistors are employed, first and second control signals input to the gates of the P-channel MOS transistors should be at levels in reverse to those of the first and second control signals input to the gates of the N-channel MOS transistors MT5 to MT12.

Figure 6:
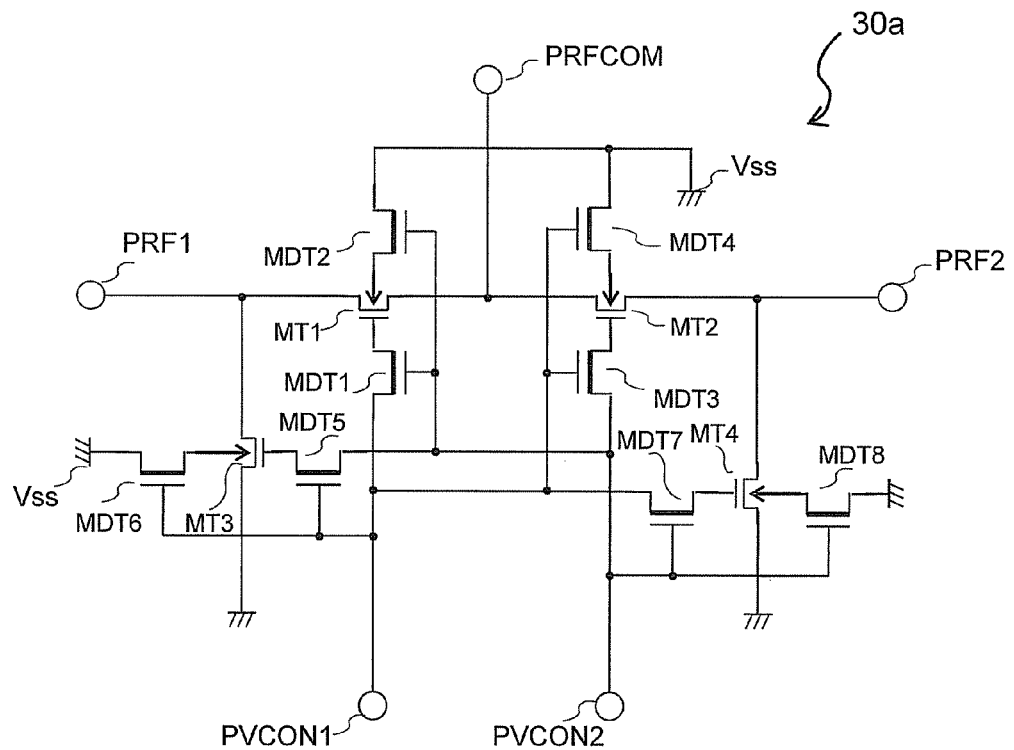
FIG. 6 is a circuit diagram showing a configuration of a high frequency switching circuit according to a second embodiment of the present invention.

A second embodiment of the present invention will be explained with reference to FIG. 6. FIG. 6 is a circuit diagram showing a configuration of a high frequency switching circuit according to the second embodiment of the present invention.

The high frequency switching circuit of the second embodiment is a SPDT (Single Pole Double Throw) type switch, which is the same as the first embodiment. In FIG. 6, the same parts as those shown in FIG. 1 are designated by the same reference numerals.

As show in FIG. 6, the high frequency switching circuit 30a is provided with N-channel MOS transistors MT1 to MT4 as insulated-gate field-effect transistor, a pair of RF (radio frequency) signal terminals PRF1, PRF2 as first high frequency signal terminals, a common RF terminal PRFCOM as a second high frequency signal terminal, control terminals PVCON1, PVCON2 as first and second control terminals, which respectively correspond to those of the high frequency switching circuit 30 of the first embodiment of FIG. 1. The N-channel MOS transistors MT1 to MT4 are an enhancement type (E-type) MOS transistor having a source, a drain, a gate and a back-gate.

The high frequency switching circuit 30a is further provided with N-channel MOS transistors MDT1 to MDT8. The N-channel MOS transistors MDT1 to MDT8 are a depletion type (D-type) MOS transistor which is a normally-on type MOS transistor having a source, a drain and a gate.

One of the source and drain of the N-channel MOS transistor MDT1 is connected to the gate of the N-channel MOS transistor MT1. The other of the source and drain of the N-channel MOS transistor MDT1 is connected to the control terminal PVCON1. The gate of the N-channel MOS transistor MDT1 receives a second control signal output from the control terminal PVCON2.

One of the source and drain of the N-channel MOS transistor MDT2 is connected to the back-gate of the N-channel MOS transistor MT1. The other of the source and drain of the N-channel MOS transistor MDT2 is connected to a power supply Vss of a lower voltage (earth voltage). The gate of the N-channel MOS transistor MDT2 receives the second control signal output from the control terminal PVCON2.

One of the source and drain of the N-channel MOS transistor MDT3 is connected to the gate of the N-channel MOS transistor MT2. The other of the source and drain of the N-channel MOS transistor MDT3 is connected to the control terminal PVCON2. The gate of the N-channel MOS transistor MDT3 receives a first control signal output from the control terminal PVCON1.

One of the source and drain of the N-channel MOS transistor MDT4 is connected to the back-gate of the N-channel MOS transistor MT1. The other of the source and drain of the N-channel MOS transistor MDT4 is connected to the power supply Vss of the lower voltage (earth voltage). The gate of the N-channel MOS transistor MDT4 receives the first control signal output from the control terminal PVCON1.

One of the source and drain of the N-channel MOS transistor MDT5 is connected to the gate of the N-channel MOS transistor MT3. The other of the source and drain of the N-channel MOS transistor MDT5 is connected to the control terminal PVCON2. The gate of the N-channel MOS transistor MDT5 receives the first control signal output from the control terminal PVCON1.

One of the source and drain of the N-channel MOS transistor MDT6 is connected to the back-gate of the N-channel MOS transistor MT3. The other of the source and drain of the N-channel MOS transistor MDT6 is connected to the power supply Vss of the lower voltage (earth voltage). The gate of the N-channel MOS transistor MDT6 receives the first control signal output from the control terminal PVCON1.

One of the source and drain of the N-channel MOS transistor MDT7 is connected to the gate of the N-channel MOS transistor MT4. The other of the source and drain of the N-channel MOS transistor MDT7 is connected to the control terminal PVCON1. The gate of the N-channel MOS transistor MDT7 receives the second control signal output from the control terminal PVCON2.

One of the source and drain of the N-channel MOS transistor MDT8 is connected to the back-gate of the N-channel MOS transistor MT4. The other of the source and drain of the N-channel MOS transistor MDT8 is connected to the power supply Vss of the lower voltage (earth voltage). The gate of the N-channel MOS transistor MDT8 receives the second control signal output from the control terminal PVCON2.

The N-channel MOS transistors MDT1 to MDT8 have an ON resistance of several $\Omega$ and an OFF resistance of approximately 10 k$\Omega$, for example. This makes it possible to set the ratio of the ON and OFF resistances as $1:10^3$ approximately. The N-channel MOS transistor MDT1 to MDT8 can function as variable resistance circuits, as those of the first embodiment, by determining the ON and OFF resistance values.

Figure 7:
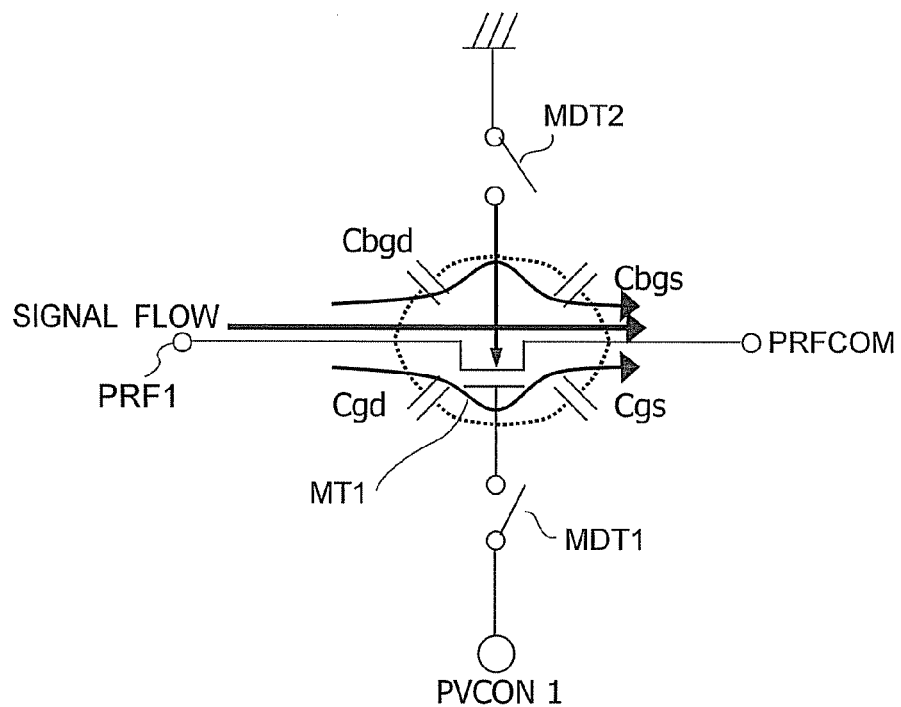
FIG. 7 is a schematic diagram showing a signal flow in an ON state of a Through FET of the second embodiment.
Figure 8:
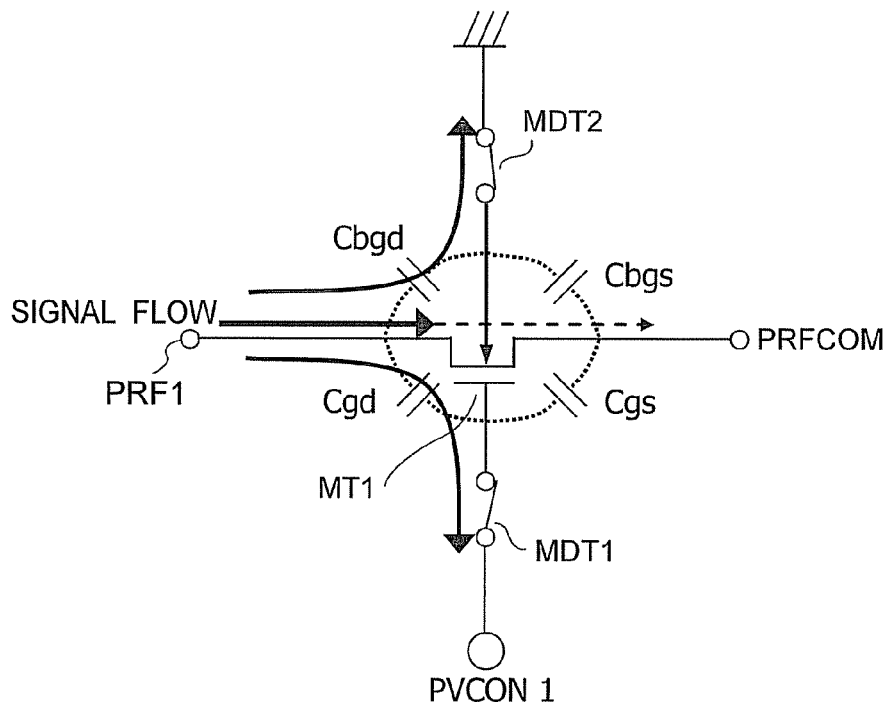
FIG. 8 is a schematic diagram showing a signal flow in an OFF state of the Through FET of the second embodiment.

Signal flows of the high frequency switching circuit 30a will be described with reference to FIGS. 7 and 8. FIGS. 7 and 8 show equivalent circuits of the portion including the N-channel MOS transistor MT1 and the surrounding which is illustrated on the left side of FIG. 6. In FIG. 7, a signal flow in an ON state of the N-channel MOS transistors MT1, MT4 of FIG. 1 is shown. In FIG. 8, a signal flow in an OFF state of the N-channel MOS transistors MT1, MT4 of FIG. 1 is shown.

As shown in FIG. 7, in the second embodiment, a "High" level of the first control signal is applied to the gate of the N-channel MOS transistor MT1 (and the N-channel MOS transistor MT4 of FIG. 6) so as to render the N-channel MOS transistor MT1 (and the N-channel MOS transistor MT4) in an ON state, when the N-channel MOS transistors MDT1 and MDT2 of the D-type, respectively connected with the gate and back-gate of the N-channel MOS transistor MT1, are in an OFF state.

The resistance of the N-channel MOS transistors MDT1 and MDT2 in the OFF state is set at approximately 10 k$\Omega$, for example, which is comparatively large. Accordingly, a high frequency signal is transmitted with a small loss from the drain to the source, respectively of the N-channel MOS transistor MT1, via the capacitance Cgd between the gate and the drain, the capacitance Cgs between the gate and the source, the capacitance Cbgd between the back-gate and the drain and the capacitance Cbgs between the back-gate and source, respectively of the N-channel MOS transistor MT1.

As shown in FIG. 8, a "Low" level of the first control signal is applied to the gate of the N-channel MOS transistor MT1 (and the N-channel MOS transistor MT4 of FIG. 6) so as to render the N-channel MOS transistor MT1 (and the N-channel MOS transistor MT4) in an OFF state, when the N-channel MOS transistors MDT1 and MDT2 of the D-type, respectively connected with the gate and back-gate of the N-channel MOS transistors MT1, are in an ON state.

The resistance of the N-channel MOS transistors MDT1 and MDT2 in the OFF state is set at approximately several Ω, for example, which is a small value comparatively. Accordingly, the high frequency signal is transmitted from the drain of the N-channel MOS transistor MT1 to the control terminal PVCON1 and the power supply Vss of the lower voltage (earth voltage) via the capacitance Cgd between the gate and drain and the capacitance Cbgd between the back-gate and drain, respectively of the N-channel MOS transistor MT1. The high frequency signal is hardly transmitted to the source of the N-channel MOS transistor MT1.

The resistance values of the N-channel MOS transistors MDT1 and MDT2 in ON and OFF states of the N-channel MOS transistor MT1 are capable of being set at appropriate values independently as variable resistance circuits. Sufficient signal transmission and isolation characteristics may be obtained when the N-channel MOS transistor MT1 is in an OFF state.

The operations of the other N-channel MOS transistors MT2 to MT4 and MDT3 to MDT8 of FIG. 6 are similar to those of the N-channel MOS transistors MT1, MDT1 and MDT2.

According to the embodiment of FIG. 6, the high frequency signals are suppressed to leak from the drain to the source, respectively of the N-channel MOS transistors MT1 to MT4 so that the signal isolation characteristic is sufficient when the N-channel MOS transistors MT1 to MT4 are in an OFF state. The signal transmission characteristic may be sufficient when the N-channel MOS transistors MT1 to MT2 are in an ON state. As a result, the switching characteristic of the second embodiment may be better than that of the prior art.

In the second embodiment, the N-channel MOS transistors MDT1 to MDT8 of the D-type may be replaced with P-channel MOS transistors of the D-type. In the case the P-channel MOS transistors of the D-type are employed, first and second control signals, which are input to the gates of the P-channel MOS transistors of the D-type, are at levels in reverse to those of the afore-mentioned first and second control signals input to the gates of the N-channel MOS transistors MDT1 to MDT8.

Figure 9:
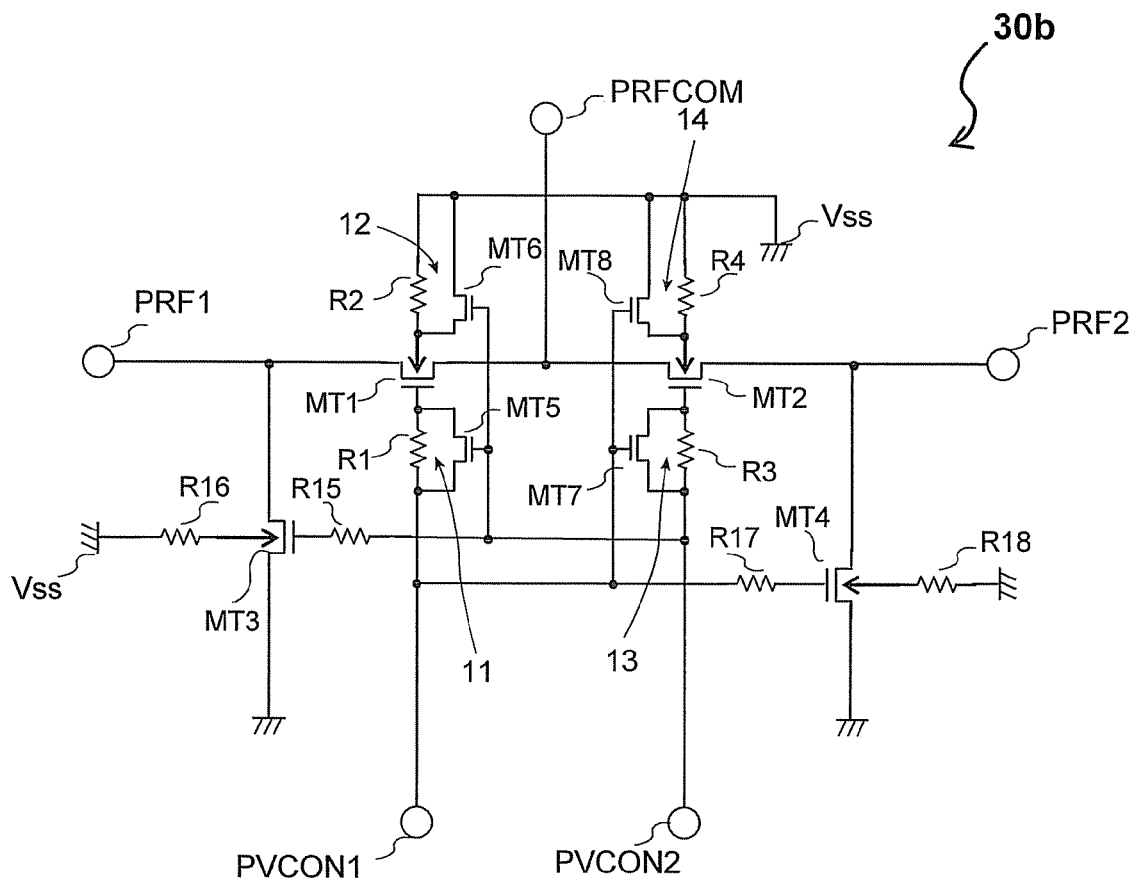
FIG. 9 is a circuit diagram showing a configuration of a high frequency switching circuit according to a third embodiment of the present invention.

A third embodiment of the present invention will be explained with reference to FIG. 9. FIG. 9 is a circuit diagram showing a configuration of a high frequency switching circuit according to the third embodiment of the present invention.

The high frequency switching circuit of the third embodiment is a SPDT (Single Pole Double Throw) type switch, which is the same as that of the first embodiment. In FIG. 6, the same parts as those shown in FIG. 1 are designated by the same reference numerals.

As show in FIG. 9, the high frequency switching circuit 30b is provided with N-channel MOS transistors MT1 to MT8 as insulated-gate field-effect transistor, resistors R1 to R4, a pair of RF (radio frequency) signal terminals PRF1, PRF2 as first high frequency signal terminals, a common RF terminal PRFCOM as a second high frequency signal terminal, control terminals PVCON1, PVCON2 as first and second control terminals, which respectively correspond to those of the high frequency switching circuit 30 of the first embodiment of FIG. 1.

The N-channel MOS transistors MT1 to MT8 are an enhancement type (E-type) MOS transistor having a source, a drain and a gate. The N-channel MOS transistors MT1 to MT4 are further provided with back-gates respectively. The N-channel MOS transistors MT5 to MT8 and the resistors R1 to R4 are connected in parallel respectively to constitute variable resistance circuits 11 to 14.

The high frequency switching circuit 30b is further provided with resistors R15 to R18. The resistors R15 to R18 are connected to the N-channel MOS transistors MT3 and MT4 respectively. N-channel MOS transistors such as the N-channel MOS transistors MT9 to MT12 of the first embodiment are not connected to the N-channel MOS transistors MT3 and MT4.

One end of the resistor R15 is connected to the control terminal PVCON2. The other end of the resistor R15 is connected to the gate of the N-channel MOS transistor MT3. One end of the resistor R16 is connected with the power supply Vss of the lower voltage (earth voltage). The other end of the resistor R16 is connected to the back-gate of the N-channel MOS transistor MT3. One end of the resistor R17 is connected to the control terminal PVCON1. The other end of the resistor R17 is connected to the gate of the N-channel MOS transistor MT4. One end of the resistor R18 is connected with the power supply Vss of the lower voltage (earth voltage). The other end of the resistor R18 is connected to the back-gate of the N-channel MOS transistor MT4.

The resistance values of the resistors R15 to R18 are determined properly in consideration of the signal transmission characteristic in an ON state and the signal isolation characteristic in an OFF state, respectively of the N-channel MOS transistors MT3 and MT4 as Shunt FETs.

high frequency signals are transmitted from the RF (radio frequency) signal terminals PRF1, PRF2. First and second control signals are provided to the control terminals PVCON1, PVCON2. The levels of the first and second control signals vary in the same manner as those of the first and second control signals of the first embodiment. Accordingly, the N-channel MOS transistors MT1 to MT8 operate in the same manner as those of the first embodiment.

According to the embodiment of FIG. 9, the resistance values of the variable resistance circuits 11 to 14 in ON and OFF state of the N-channel MOS transistors MT5, MT6 are capable of being determined as appropriate values independently, in consideration of signal transmission and isolation of the high frequency signals. As a result, the signal transmission and isolation characteristics may be sufficient.

The resistances values of the variable resistance circuits 11 to 14 in an ON state of the N-channel MOS transistor MT1 and MT2 may be approximately $10^3$ times or more as large as those in an OFF state of the N-channel MOS transistor MT1 and MT2.

Accordingly, the signal isolation characteristic of the N-channel MOS transistors MT1 and MT2 may be sufficient. The signal transmission characteristic of the high frequency signals may be sufficient when the N-channel MOS transistors MT1 and MT2 are in an ON state. The high frequency switching circuit 30b of the third embodiment may reduce the number of elements to be employed more than the high frequency switching circuit 30 of the first embodiment.

In the third embodiment, the variable resistance circuits 11 to 14 are connected to the gates and back-gates of the N-channel MOS transistors MT1 and MT2. The variable resistance circuits 11 to 14 may be replaced with D-type N-channel MOS transistors.

In the afore-mentioned embodiments, the MOS transistors are provided as insulated-gate field-effect transistors in the high frequency switching circuits. The MOS transistors may be replaced with field-effect transistors of GaAs or junction transistors.

The afore-mentioned embodiments are a SPDT (Single Pole Double Throw) type switch. The invention may be applied to a SPnT type or an mPnT type switch. The SPnT type switch has one pole and "n" throws, where the "n" is a number of integer equal to three or more. The mPnT type switch has "m" poles and "n" throws, where the "m" is a number of integer equal to two or more and where the "n" is a number of integer equal to two or more.

The fundamental structure of the high frequency switching circuits may be constituted by at least one Through FET and at least one variable resistance circuit which is connected to the gate of the Through FET.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A high frequency switching circuit comprising:
   first and second high frequency signal terminals;
   a first control terminal;
   a power supply terminal;
   a first field-effect transistor having a drain, a source, a gate, and a back gate, the first field-effect transistor being connected between the first and the second high frequency signal terminals to switch higher frequency signals;
   a first variable resistance circuit connected between the gate of the first field-effect transistor and the first control terminal; and
   a second variable resistance circuit connected between the back gate and the power supply,
   wherein each of the resistance values of the first and the second variable resistance circuits is lower in an OFF state of the first field-effect transistor than in an ON state of the first field-effect transistor.

2. The high frequency switching circuit according to claim 1, wherein each of the first and the second variable resistance circuits is provided with a resistance and a field-effect transistor connected in parallel with each other.

3. The high frequency switching circuit according to claim 1, wherein each of the first and the second variable resistance circuits is provided with a normally-on type field-effect transistor.

4. The high frequency switching circuit according to claim 1, further comprising a second field-effect transistor having a drain, a source and a gate, the second field-effect transistor being connected between one of the drain and the source of the first field-effect transistor and a power supply terminal.

5. The high frequency switching circuit according to claim 4, further comprising a second control terminal and a third variable resistance circuit connected between the second control terminal and the gate of the second field-effect transistor.

6. The high frequency switching circuit according to claim 5, wherein the second field-effect transistor has a back gate to which a fourth variable resistance circuit is connected.

7. A high frequency switching circuit comprising:
   first and second high frequency signal terminals;
   a power supply terminal;
   a first control terminal;
   a first field-effect transistor having a drain, a source and a gate, the first field-effect transistor being connected between the first and the second high frequency signal terminals to switch a higher frequency signal;
   a second field-effect transistor having a drain, a source, a gate and a back gate, the second field-effect transistor being connected between the first high frequency signal terminal and the power supply terminal;
   a third variable resistance circuit connected between the gate of the second field-effect transistor and the second control terminal; and
   a fourth variable resistance circuit connected between the back gate of the second field-effect transistor and the power supply terminal,
   wherein each of the resistance values of the third and the fourth variable resistance circuits is lower in an OFF state of the second field-effect transistor than in an ON state of the second field-effect transistor.

8. The high frequency switching circuit according to claim 7, wherein each of the third and the fourth variable resistance circuits is provided with a resistance and a field-effect transistor connected in parallel with each other.

9. The high frequency switching circuit according to claim 7, wherein each of the third and the fourth variable resistance circuits is provided with a normally-on type field-effect transistor, and each of the gates of the normally-on type field-effect transistors is connected to the first control terminal.

10. The high frequency switching circuit according to claim 7, further comprising a first variable resistance circuit, the first variable resistance being connected between the gate of the first field-effect transistor and the first control terminal.

11. A high frequency switching circuit comprising:
    a pair of first high frequency signal terminals;
    a second high frequency signal terminal serving as a common high frequency signal terminal;
    first and second control terminals;
    a power supply terminal;
    a pair of first field-effect transistors respectively having a drain, a source a gate and a back gate, the first field-effect transistors being respectively connected between the first high frequency signal terminals and the second high frequency signal terminal
    a pair of first variable resistance circuits connected between the gates of the first field-effect transistors and the first and second control terminals respectively; and
    a pair of second variable resistance circuits connected between the back gate of the first field-effect transistors and the power supply terminal,
    wherein each of the resistance values of the first and the second variable resistance circuits is lower in an OFF state of the first field-effect transistors than in an ON state of the first field-effect transistors.

12. The high frequency switching circuit according to claim 11, wherein each of the first and the second variable resistance circuit is provided with a resistance and a field-effect transistor connected in parallel with each other.

13. The high frequency switching circuit according to claim 11, wherein each the first and the second variable resistance circuit is provided with a normally-on type field-effect transistor.

14. The high frequency switching circuit according to claim 11, further comprising a pair of second field-effect transistors having drains, sources and gates respectively, the second field-effect transistors being respectively connected between the first high frequency signal terminals and a power supply terminal, and the gates being connected to the second and the first control terminals respectively.

15. The high frequency switching circuit according to claim 14, further comprising a pair of third variable resistance circuits, third variable resistance circuits being connected between the gates of the second field-effect transistors and the second and the first control terminals respectively.

16. The high frequency switching circuit according to claim 15, further comprising a pair of fourth variable resistance circuits, wherein each of the second field-effect transistors has a back gate, and each of the fourth variable resistance circuits is connected between each of the back gates and a power supply terminal.

17. The high frequency switching circuit according to claim 16, wherein the first and second field-effect transistors are N-channel type and the field-effect transistors constituting the fourth variable resistance circuits are P-channel type.

18. The high frequency switching circuit according to claim 1, wherein the resistance values of the first and the second variable resistance circuits are controlled by a control signal being provided to the second control terminal.

19. The high frequency switching circuit according to claim 7, wherein the resistance values of the third and the fourth variable resistance circuits are controlled by a control signal being provided to the first control terminal.

20. The high frequency switching circuit according to claim 11,
wherein the resistance values of the first and the second variable resistance circuits respectively connected to one of the first field-effect transistors are controlled by a second control signal being provided to the second control terminal,
and wherein the resistance values of the first and the second variable resistance circuits respectively connected to the other of the first field-effect transistors are controlled by a first control signal being provided to the first control terminal.

* * * * *